US012740388B2

(12) United States Patent
Loubet et al.

(10) Patent No.: US 12,740,388 B2
(45) Date of Patent: Sep. 15, 2026

(54) TRANSISTORS WITH BOTTOM DIELECTRIC ISOLATION AND FULLY SELF-ALIGNED DIRECT BACKSIDE CONTACT

(71) Applicant: INTERNATIONAL BUSINESS MACHINES CORPORATION, Armonk, NY (US)

(72) Inventors: Nicolas Jean Loubet, Guilderland, NY (US); Shogo Mochizuki, Mechanicville, NY (US); Ruilong Xie, Niskayuna, NY (US); Julien Frougier, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 458 days.

(21) Appl. No.: 18/336,066

(22) Filed: Jun. 16, 2023

(65) Prior Publication Data

US 2024/0421035 A1 Dec. 19, 2024

(51) Int. Cl.

| | |
|---|---|
| ***H10W 20/20*** | (2026.01) |
| ***H10D 30/43*** | (2025.01) |
| ***H10D 30/67*** | (2025.01) |
| ***H10D 62/10*** | (2025.01) |
| ***H10D 84/01*** | (2026.01) |
| ***H10D 84/03*** | (2025.01) |
| ***H10D 84/83*** | (2025.01) |

(52) U.S. Cl.

CPC ............ *H10W 20/20* (2026.01); *H10D 30/43* (2025.01); *H10D 30/6729* (2025.01); (Continued)

(58) Field of Classification Search

CPC ............. H01L 23/481; H01L 21/76805; H01L 23/5286; H01L 21/76897; H01L 29/0843; H01L 29/0649; H01L 29/785; H01L 23/528; H01L 21/28518; H01L 29/41766; H01L 29/665; H01L 29/0653; H01L 29/0673; H01L 29/4175; H01L 29/42392; (Continued)

(56) References Cited

U.S. PATENT DOCUMENTS

| | | |
|---|---|---|
| 11,233,005 B1 | 1/2022 | Chen |
| 11,264,327 B2 | 3/2022 | Chiang |

(Continued)

FOREIGN PATENT DOCUMENTS

| | | |
|---|---|---|
| TW | 201216470 A | 4/2012 |
| TW | 202145484 A | 12/2021 |

(Continued)

OTHER PUBLICATIONS

International Searching Authority, "Notification of Transmittal of the International Search Report and the Written Opinion of the International Searching Authority, or Declaration," Patent Cooperation Treaty, Sep. 17, 2024, 17 pages, International Application No. PCT/EP2024/066533.

*Primary Examiner* — Jonathan Han
(74) *Attorney, Agent, or Firm* — Samuel A. Waldbaum

(57) ABSTRACT

A microelectronic device including a nanosheet transistor that includes a first source/drain and a second source/drain. A frontside contact connected to the first source/drain and a backside contact connected to the second source/drain. A plurality of isolation layers located beneath the nanosheet transistor, and the second source/drain extends through the plurality of isolation layers to connect with the backside contact.

18 Claims, 25 Drawing Sheets

CROSS- SECTION X1

(52) U.S. Cl.
CPC ..... *H10D 30/6735* (2025.01); *H10D 30/6757* (2025.01); *H10D 62/121* (2025.01); *H10D 84/0128* (2025.01); *H10D 84/0149* (2025.01); *H10D 84/038* (2025.01); *H10D 84/83* (2025.01)

(58) Field of Classification Search
CPC . H01L 29/66439; H01L 29/775; H10D 30/43; H10D 30/6729; H10D 30/6735; H10D 30/6757; H10D 62/121; H10D 84/0128; H10D 84/0149; H10D 84/038; H10D 84/83; H10D 30/014; H10D 30/0198; H10D 62/151; H10D 64/251; H10D 64/254; H10D 84/013; B82Y 10/00; H10W 20/20; H10W 20/083; H10W 20/427; H10W 20/069; H10W 20/0696; H10W 20/481
See application file for complete search history.

(56) References Cited

U.S. PATENT DOCUMENTS

| | | | | |
|---|---|---|---|---|
| 11,437,379 | B2 | 9/2022 | Song | |
| 2011/0316083 | A1 | 12/2011 | Cheng et al. | |
| 2020/0126987 | A1 | 4/2020 | Rubin et al. | |
| 2021/0111115 | A1 | 4/2021 | Patrick | |
| 2021/0134721 | A1 | 5/2021 | Chiang | |
| 2021/0202385 | A1 | 7/2021 | Huang | |
| 2021/0305252 | A1 | 9/2021 | Chiang | |
| 2021/0305381 | A1 | 9/2021 | Chiang | |
| 2021/0336012 | A1* | 10/2021 | Huang | H10D 64/01 |
| 2021/0351303 | A1 | 11/2021 | Ju | |
| 2021/0376071 | A1 | 12/2021 | Liu | |
| 2021/0376093 | A1 | 12/2021 | Chu | |
| 2021/0391421 | A1 | 12/2021 | Chu | |
| 2022/0013453 | A1* | 1/2022 | Chen | H10D 64/256 |
| 2022/0037496 | A1 | 2/2022 | Chen et al. | |
| 2022/0165733 | A1 | 5/2022 | Chen | |
| 2022/0328657 | A1 | 10/2022 | Lu et al. | |
| 2022/0359747 | A1 | 11/2022 | Chen | |
| 2022/0367454 | A1 | 11/2022 | Chung et al. | |
| 2022/0367619 | A1 | 11/2022 | Yu et al. | |
| 2022/0375939 | A1 | 11/2022 | Sharma et al. | |
| 2023/0012147 | A1 | 1/2023 | Chu et al. | |
| 2023/0145229 | A1 | 5/2023 | Thomas et al. | |
| 2024/0114694 | A1* | 4/2024 | Dutta | H10D 1/682 |
| 2024/0355708 | A1* | 10/2024 | Huang | H01L 21/76897 |

FOREIGN PATENT DOCUMENTS

| | | | |
|---|---|---|---|
| TW | 202518712 | A | 5/2025 |
| WO | 2024/256630 | A1 | 12/2024 |

* cited by examiner

TOP DOWN VIEW

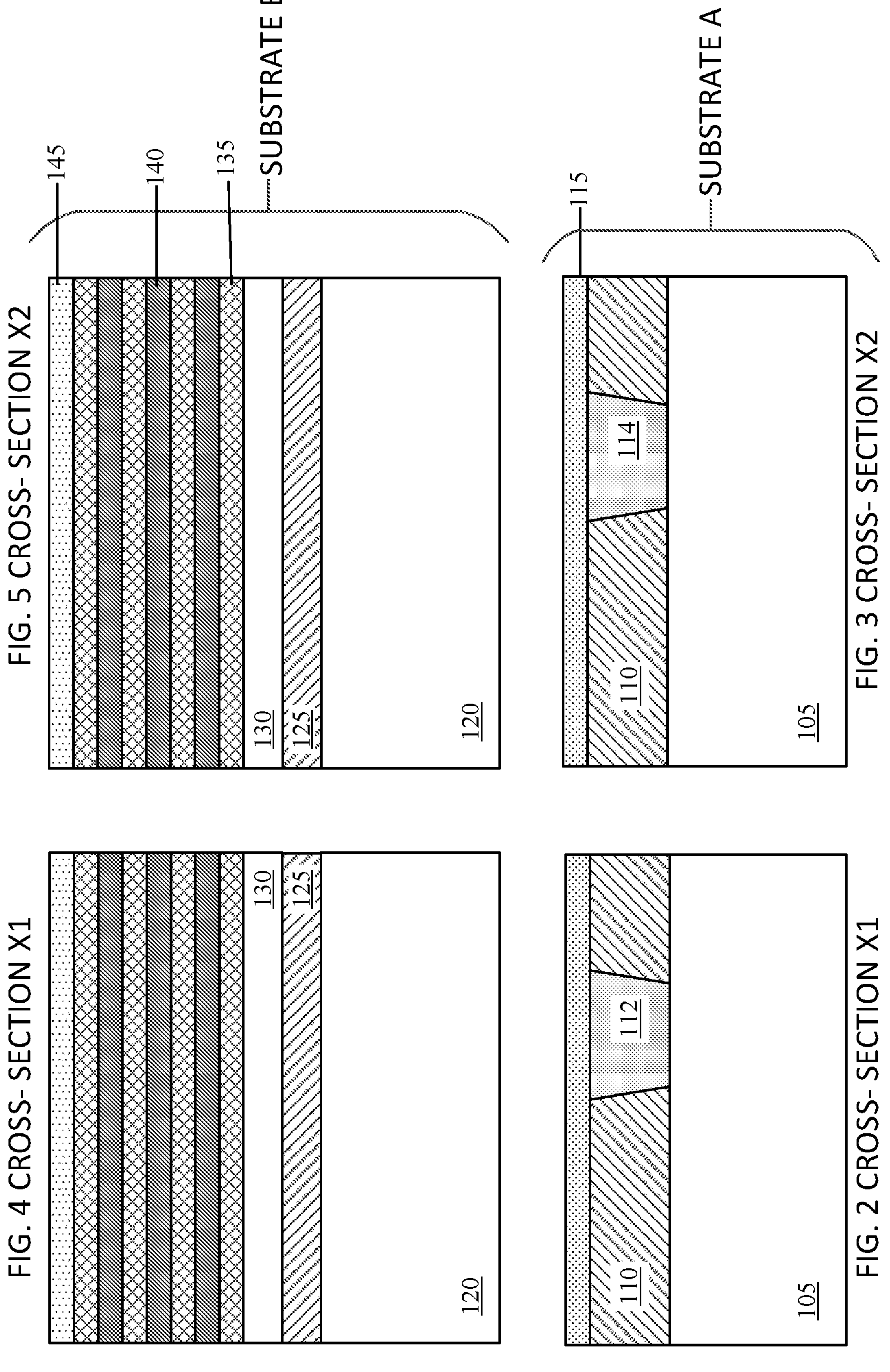
FIG. 5 CROSS- SECTION X2
FIG. 4 CROSS- SECTION X1
FIG. 3 CROSS- SECTION X2
FIG. 2 CROSS- SECTION X1

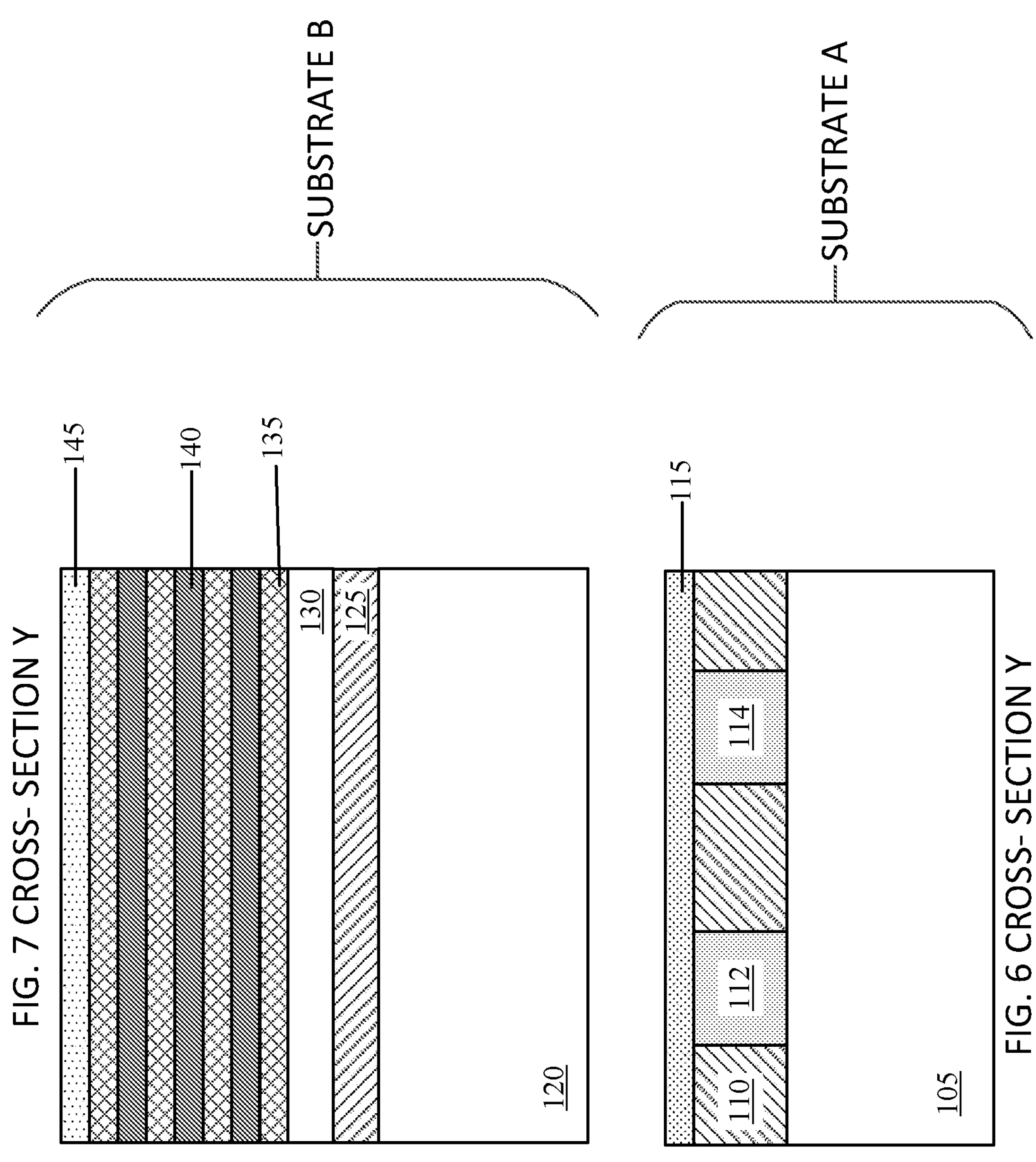
FIG. 7 CROSS- SECTION Y
FIG. 6 CROSS- SECTION Y

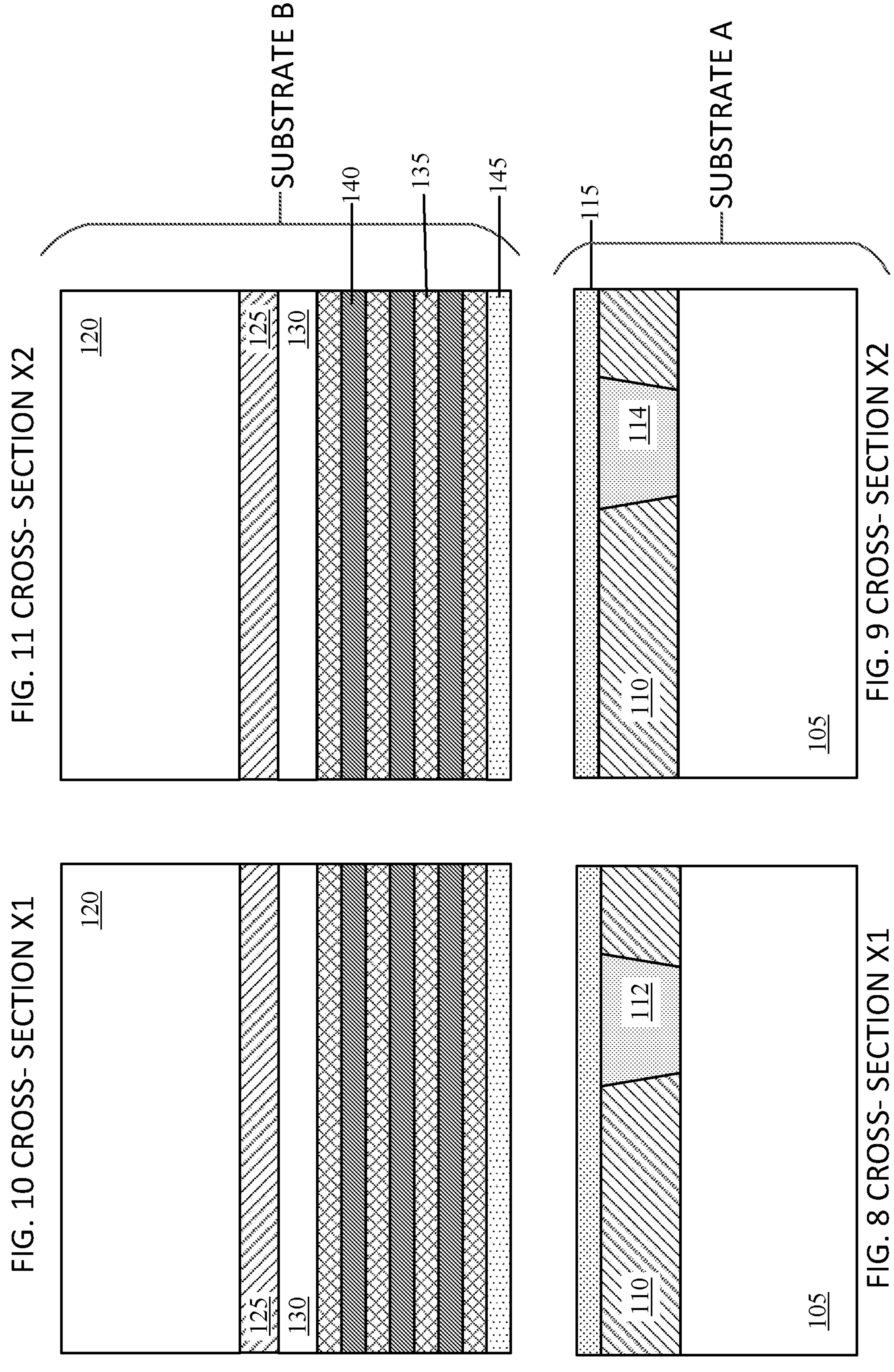
SUBSTRATE B
140
135
145
120
125
130
FIG. 11 CROSS- SECTION X2
FIG. 10 CROSS- SECTION X1
115
SUBSTRATE A
114
110
105
112
FIG. 9 CROSS- SECTION X2
FIG. 8 CROSS- SECTION X1

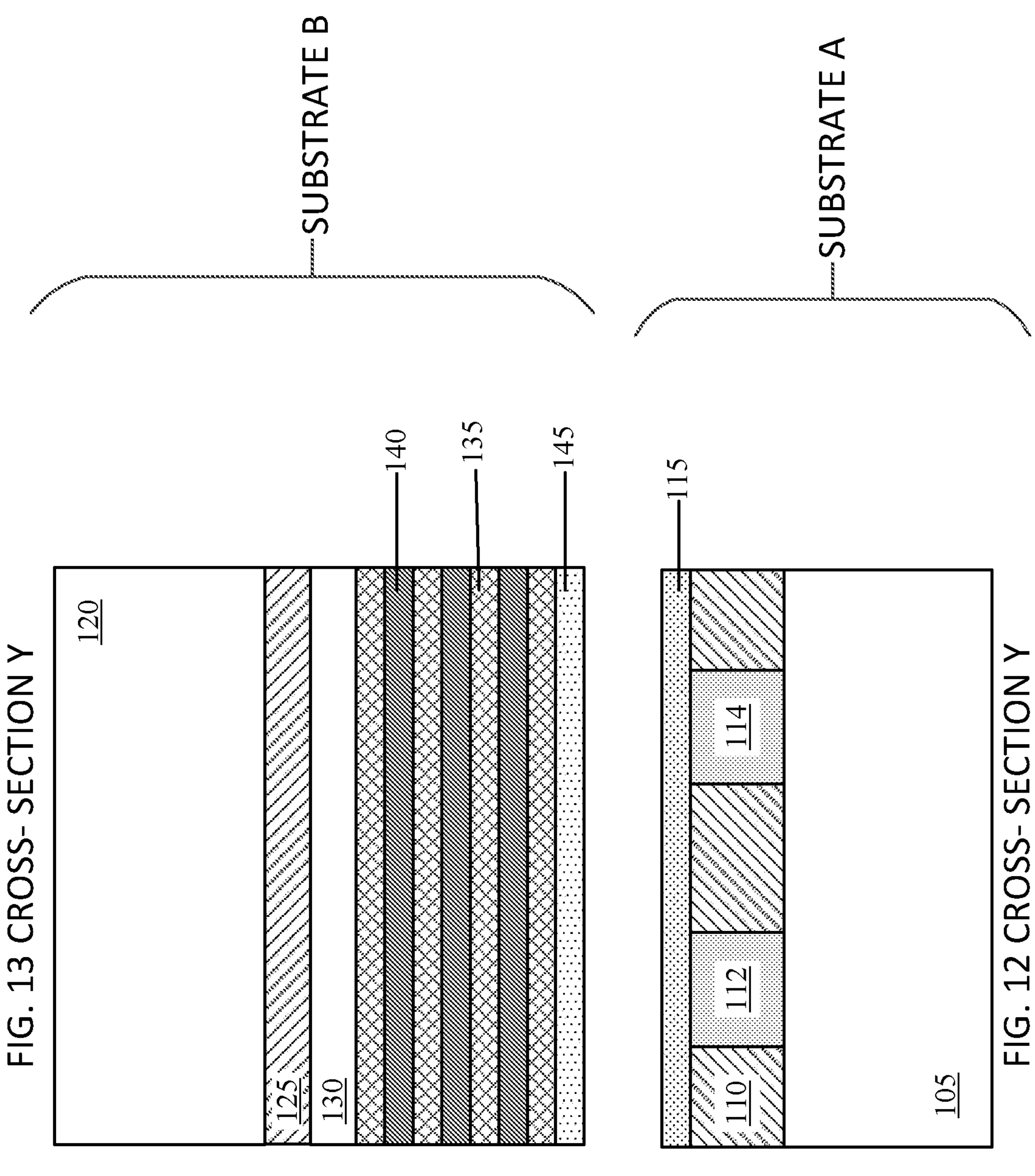
FIG. 13 CROSS- SECTION Y
FIG. 12 CROSS- SECTION Y

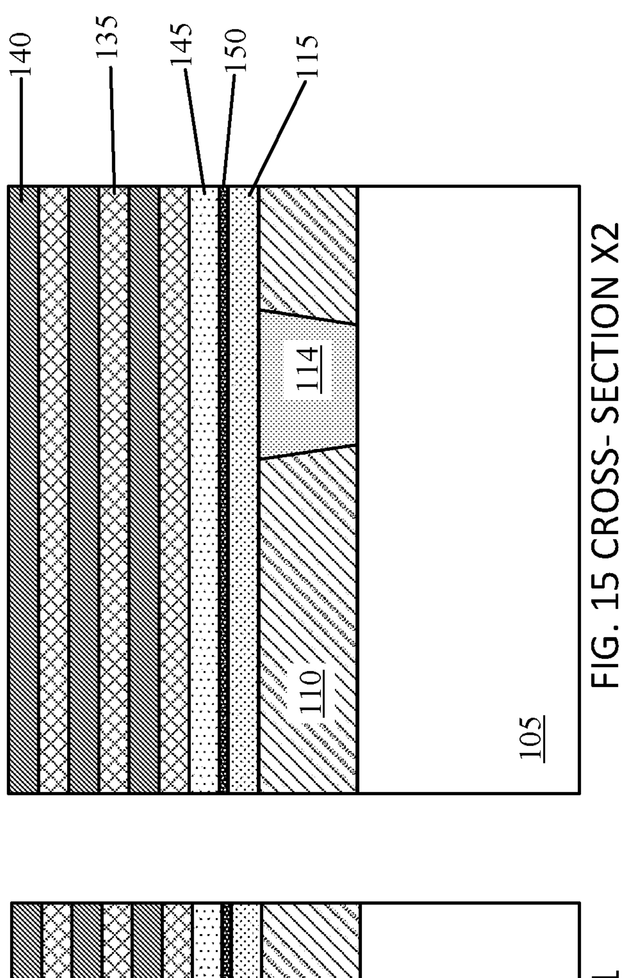
FIG. 15 CROSS- SECTION X2
FIG. 14 CROSS- SECTION X1

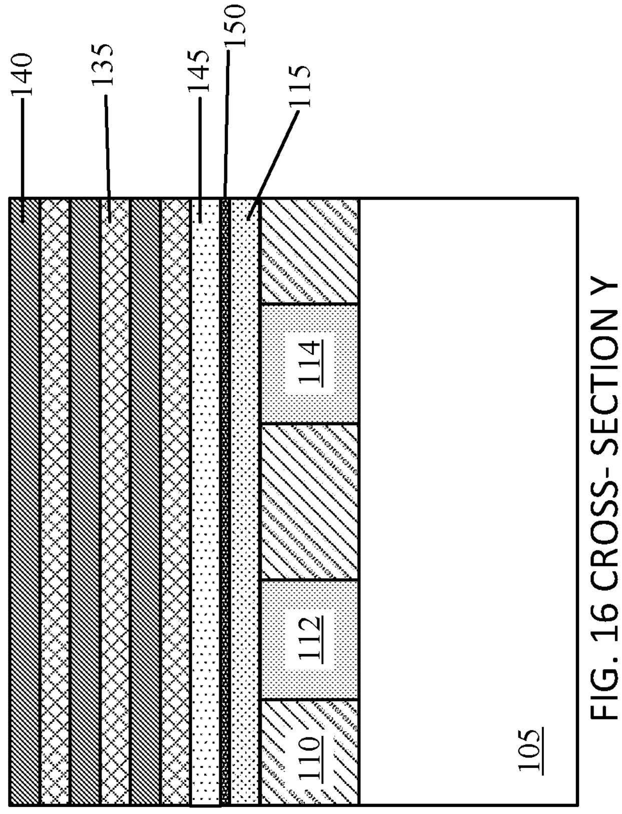
FIG. 16 CROSS- SECTION Y

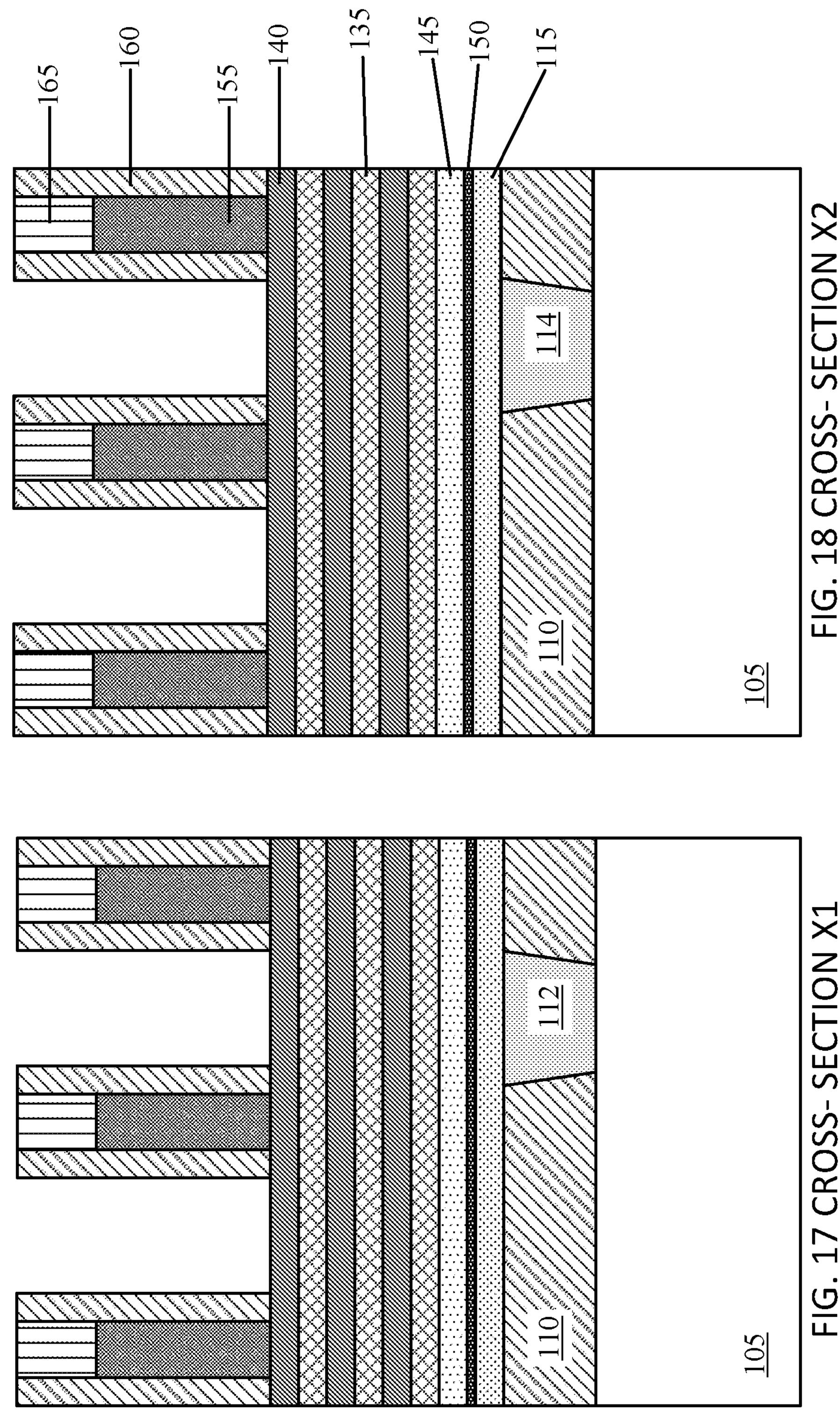
FIG. 18 CROSS- SECTION X2
FIG. 17 CROSS- SECTION X1

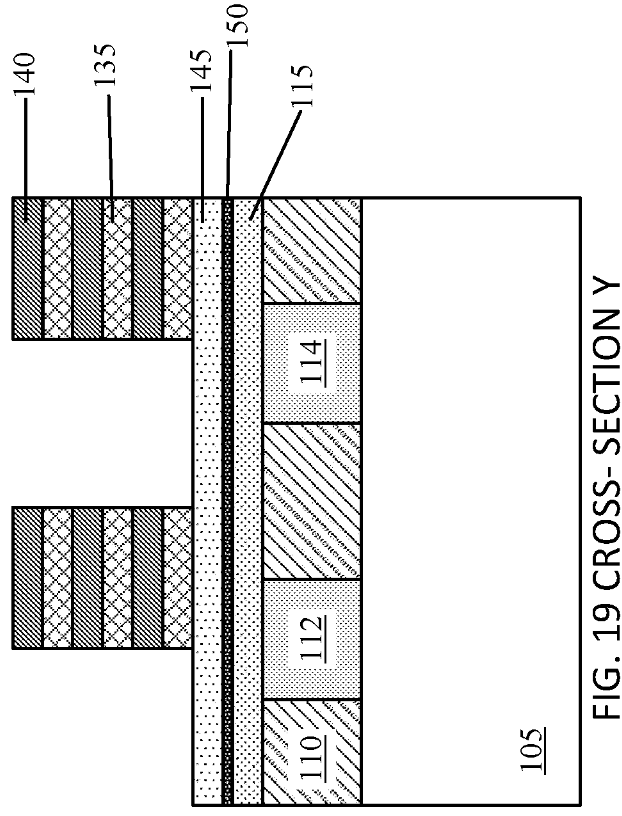
FIG. 19 CROSS- SECTION Y

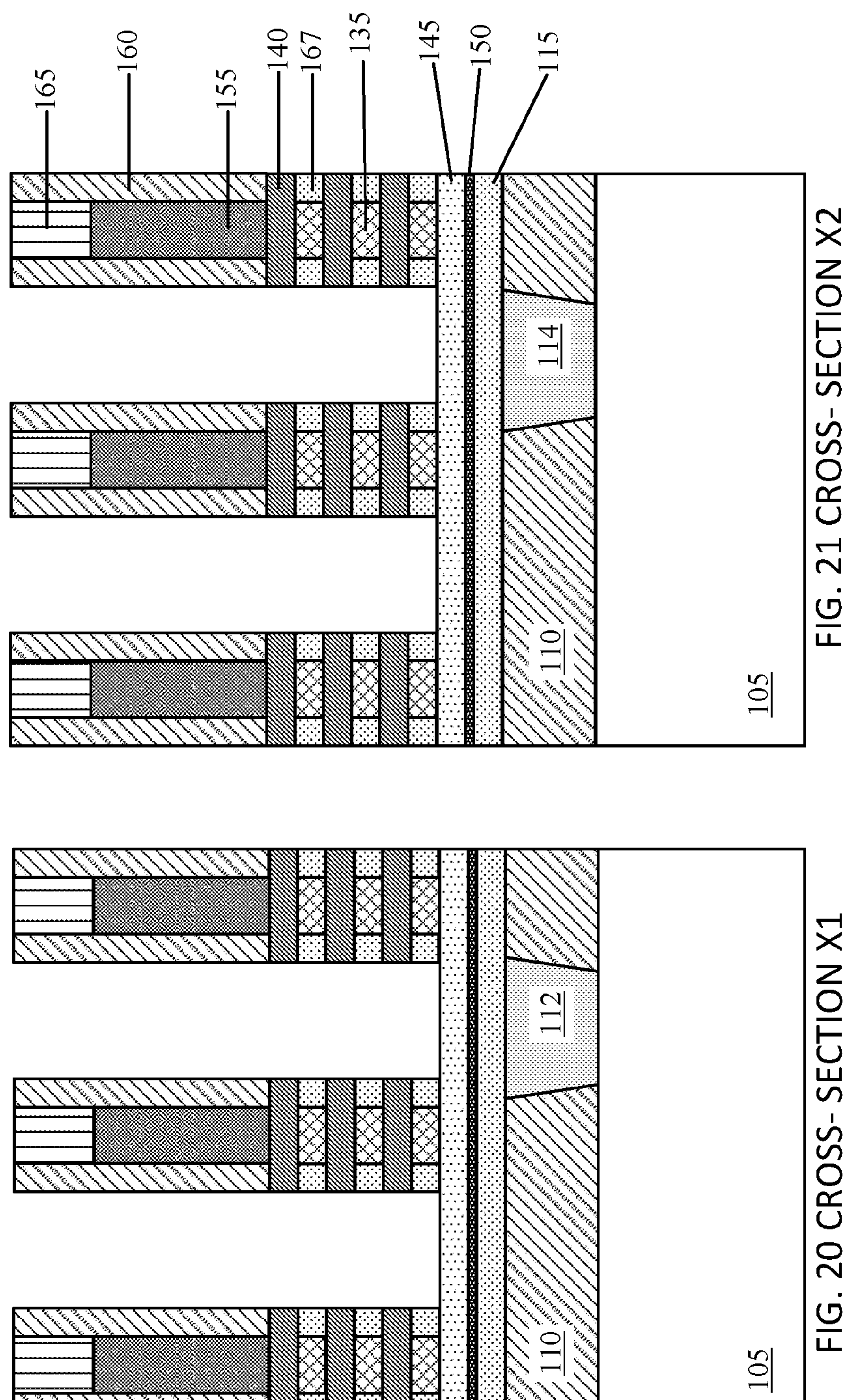
FIG. 21 CROSS- SECTION X2
FIG. 20 CROSS- SECTION X1

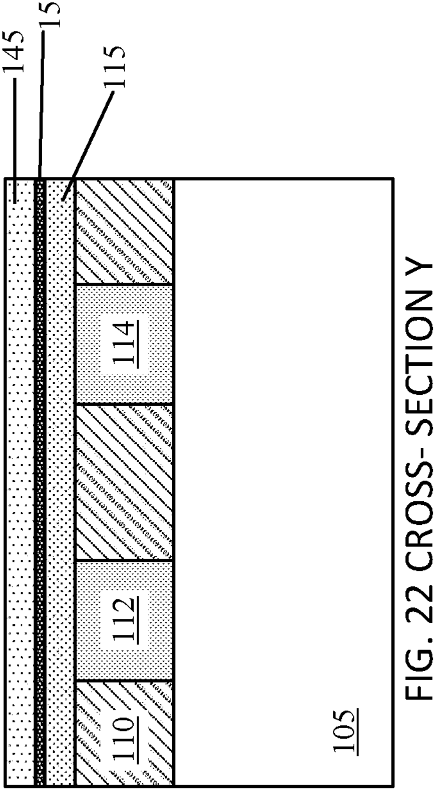
FIG. 22 CROSS- SECTION Y

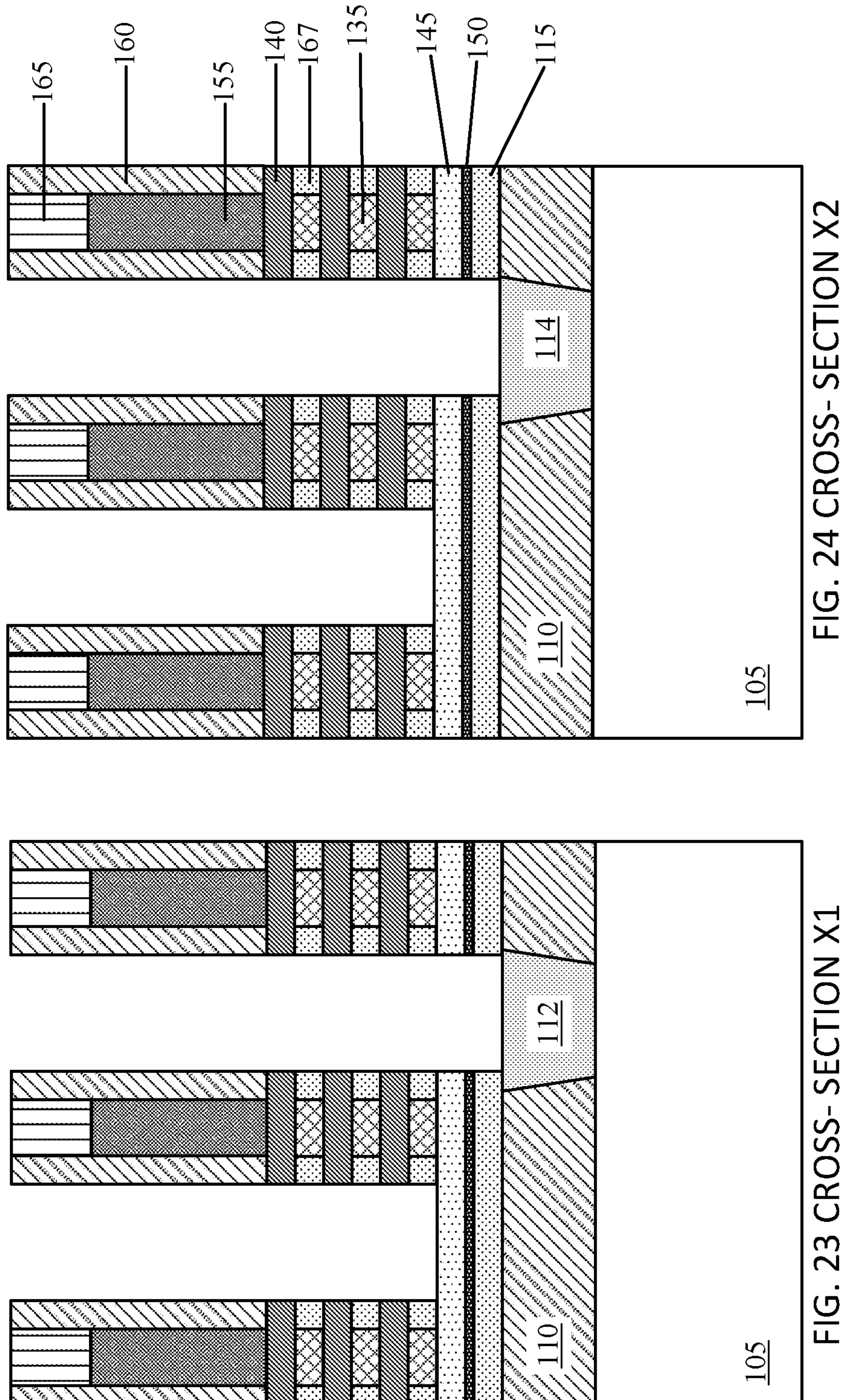
FIG. 24 CROSS- SECTION X2
FIG. 23 CROSS- SECTION X1

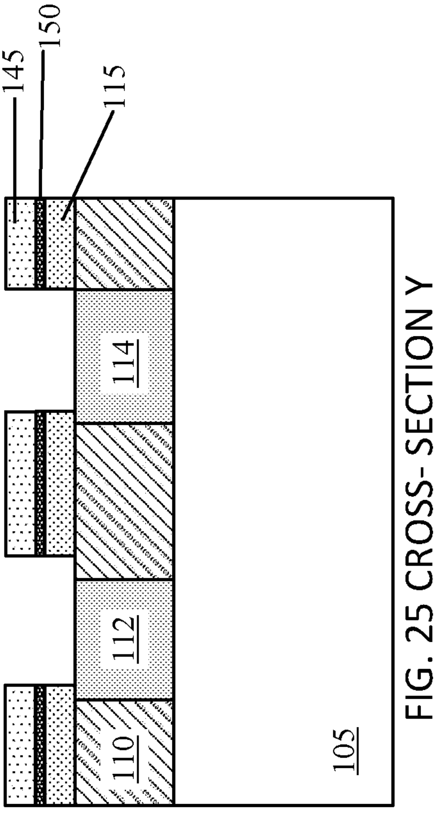
FIG. 25 CROSS- SECTION Y

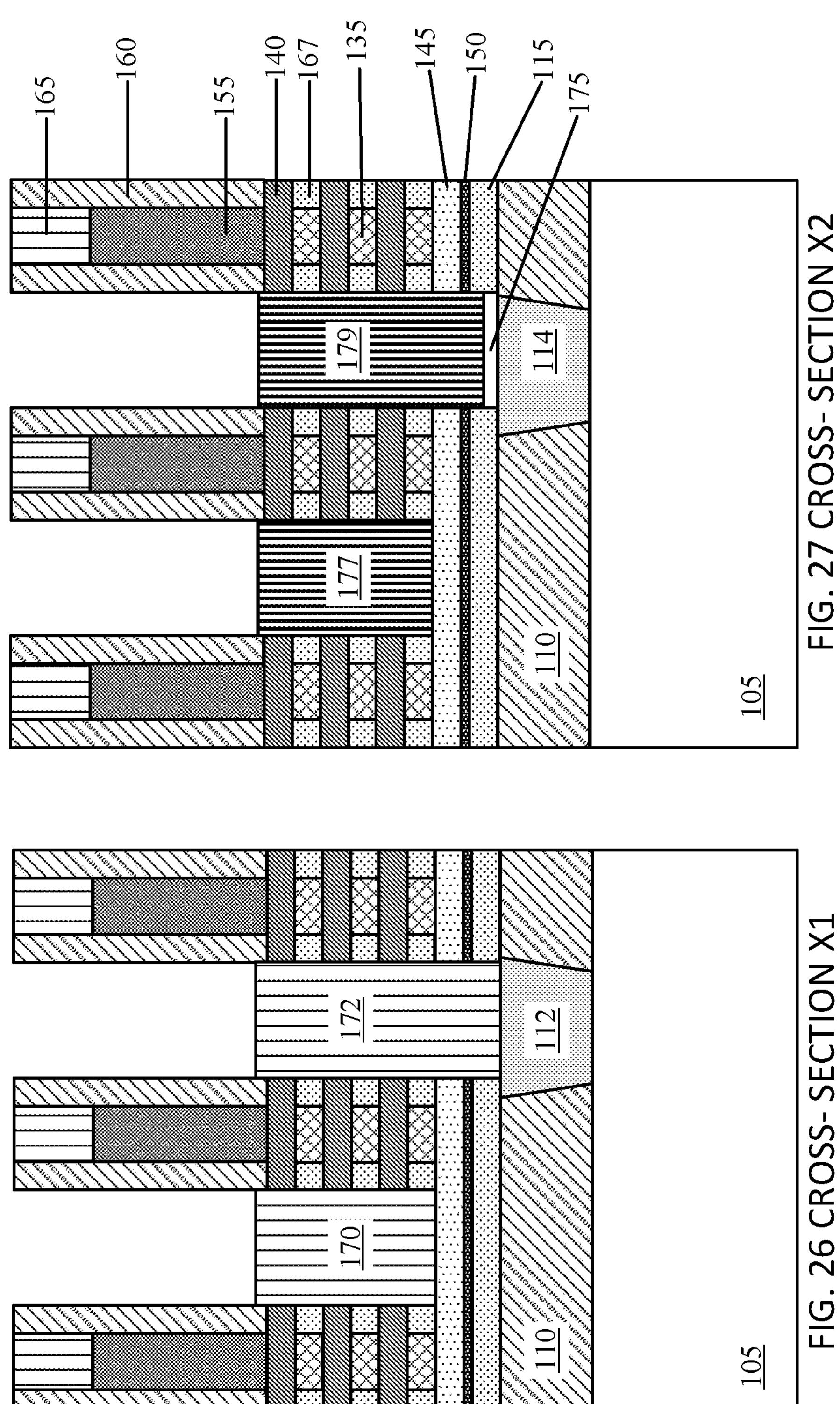
FIG. 27 CROSS- SECTION X2
FIG. 26 CROSS- SECTION X1

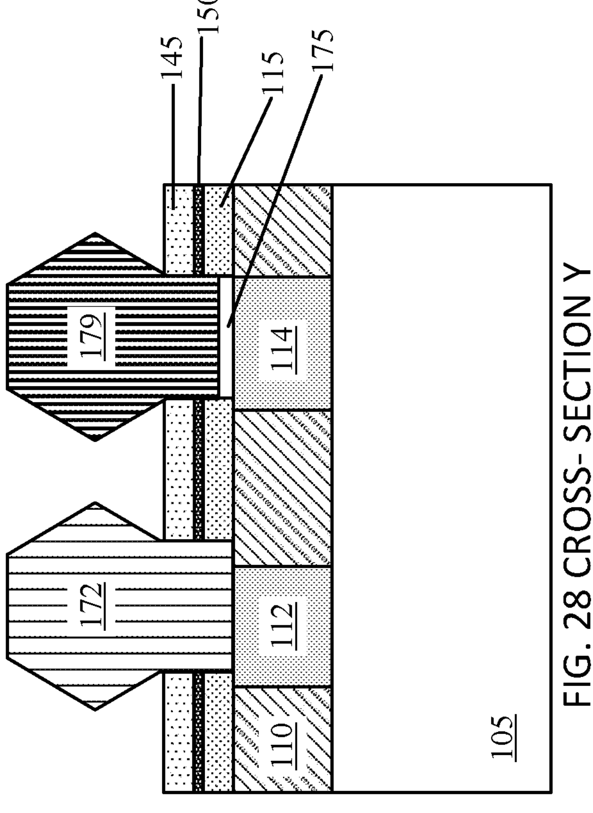
FIG. 28 CROSS- SECTION Y

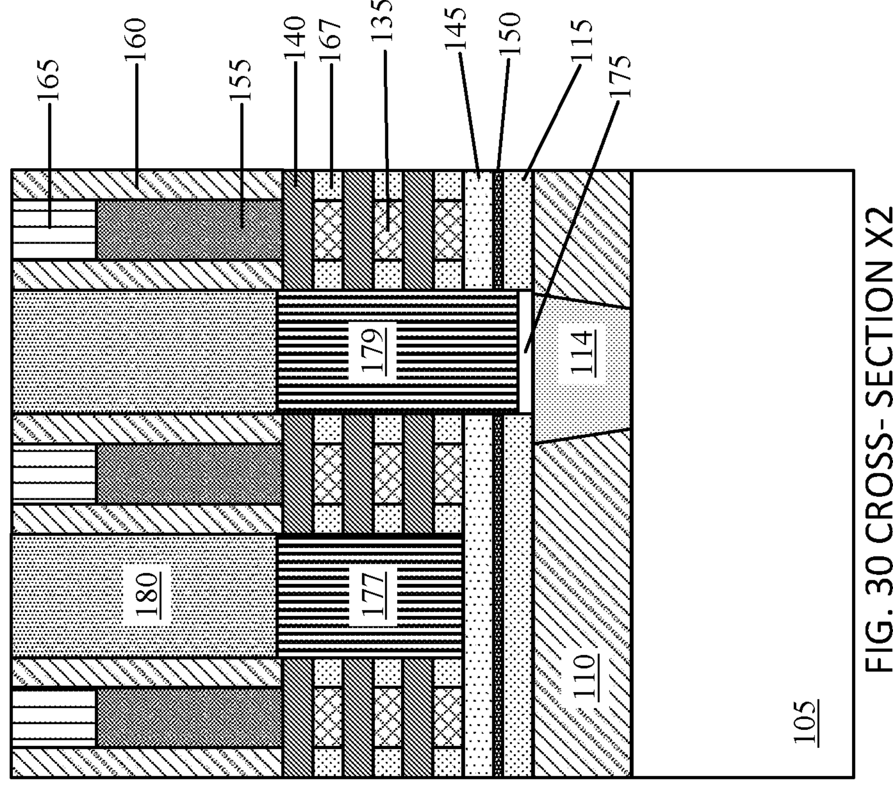
FIG. 30 CROSS- SECTION X2
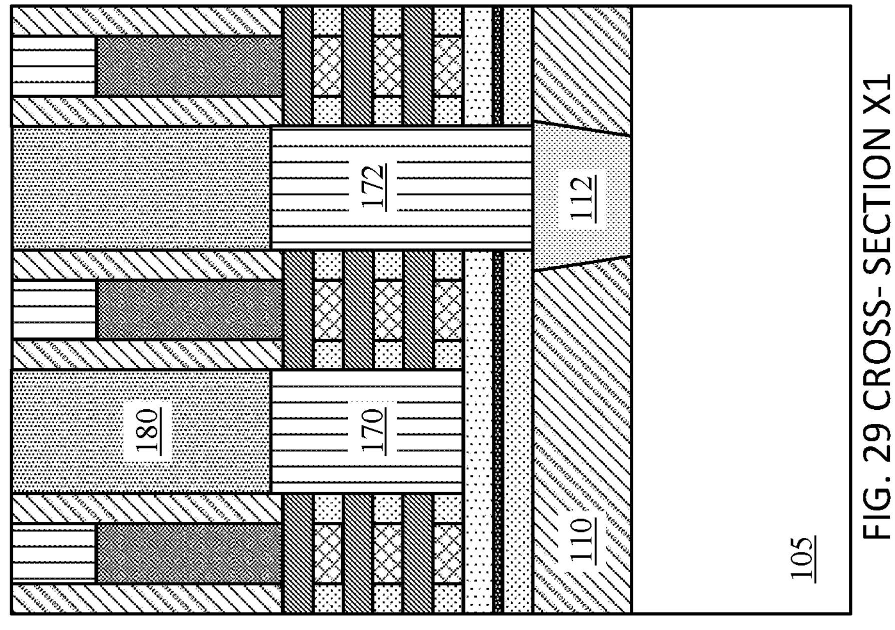
FIG. 29 CROSS- SECTION X1

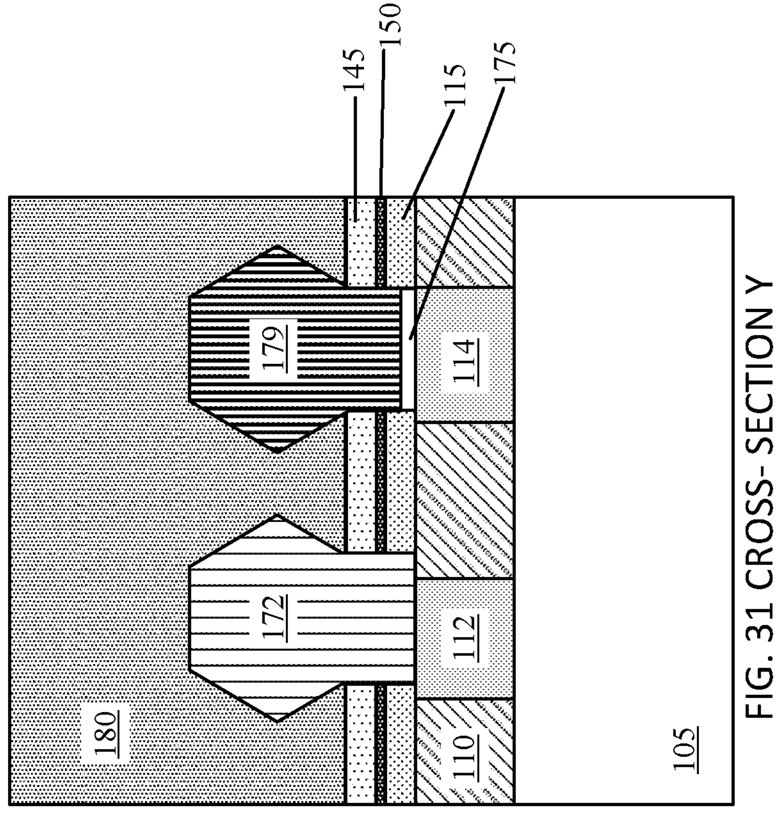
FIG. 31 CROSS- SECTION Y

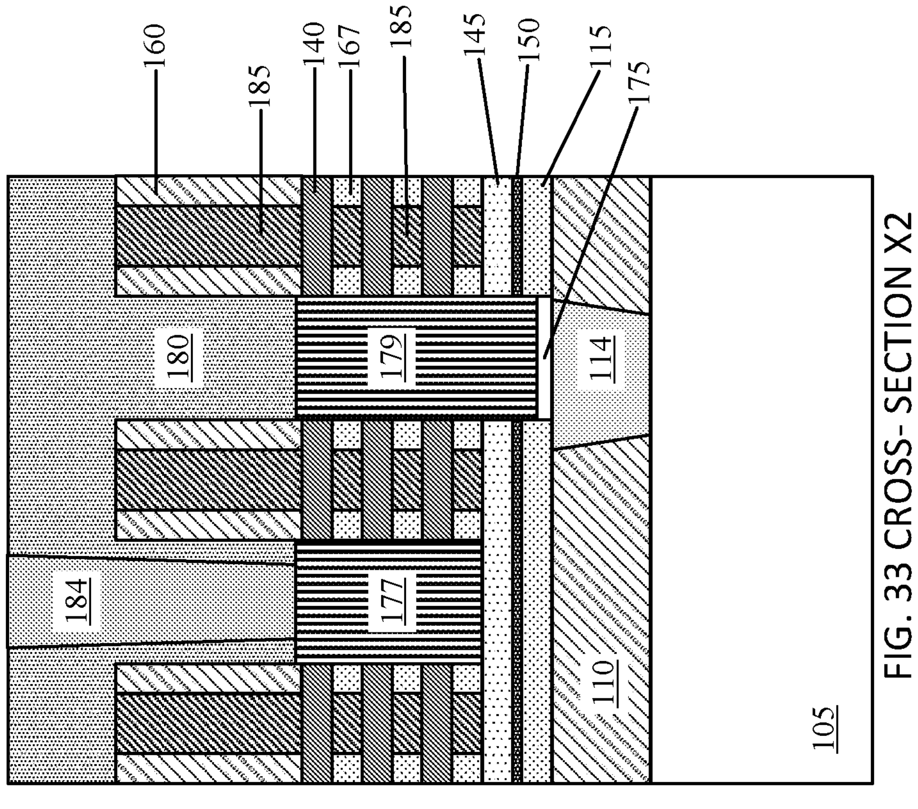
FIG. 33 CROSS- SECTION X2
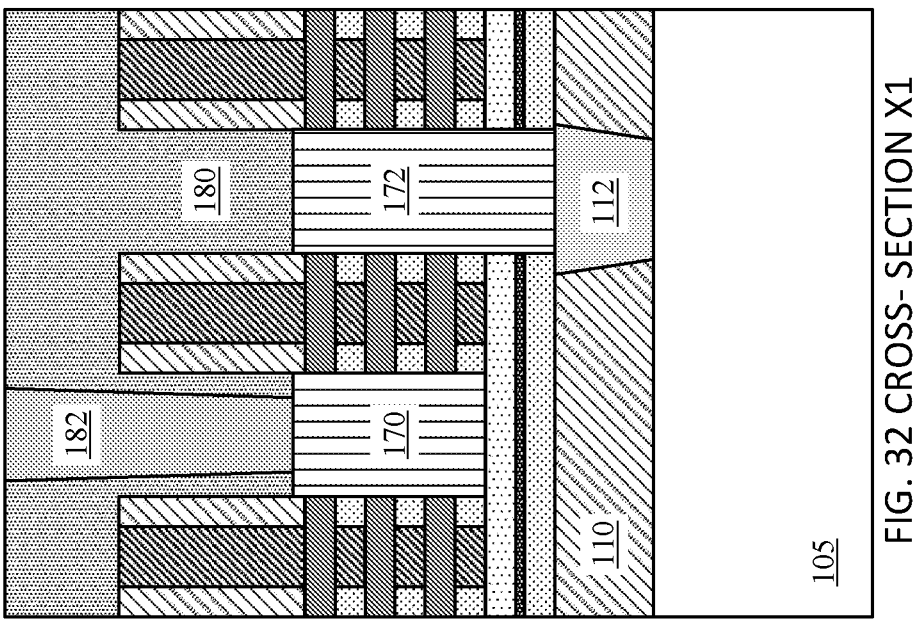
FIG. 32 CROSS- SECTION X1

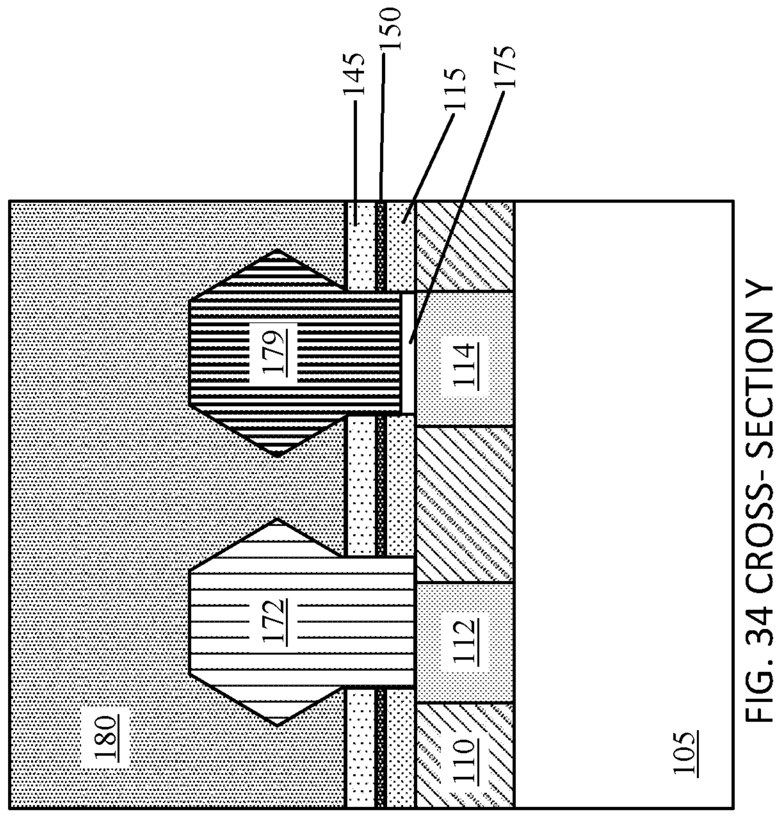
FIG. 34 CROSS- SECTION Y

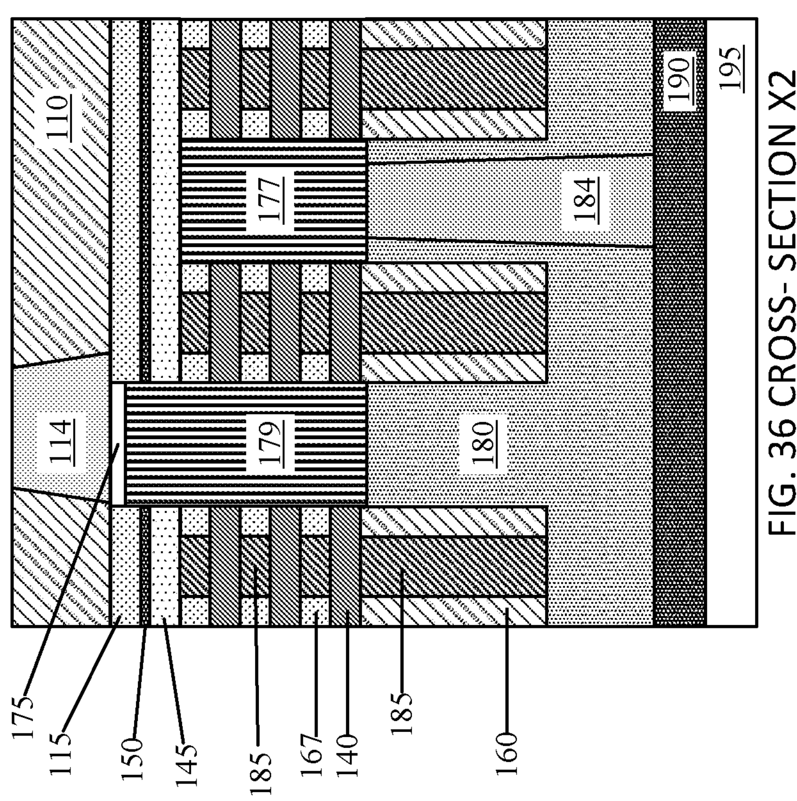
FIG. 36 CROSS- SECTION X2
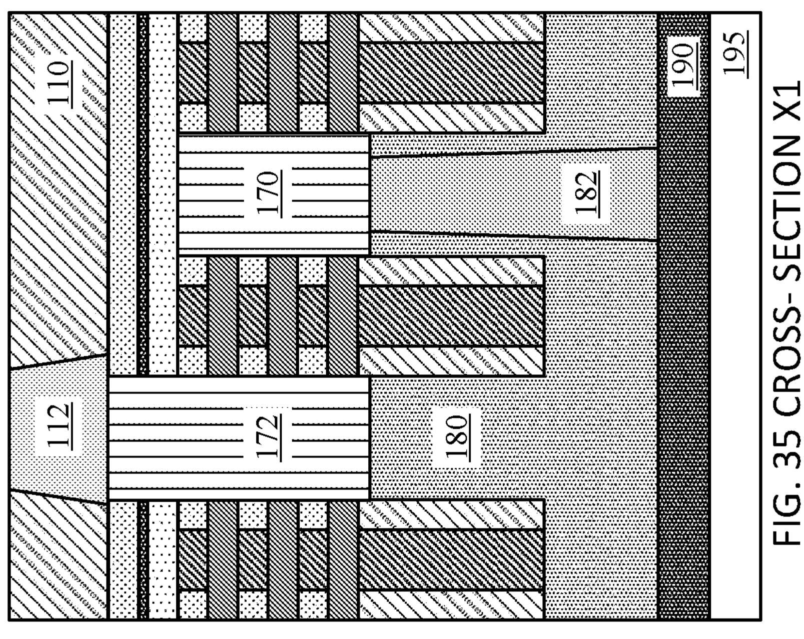
FIG. 35 CROSS- SECTION X1

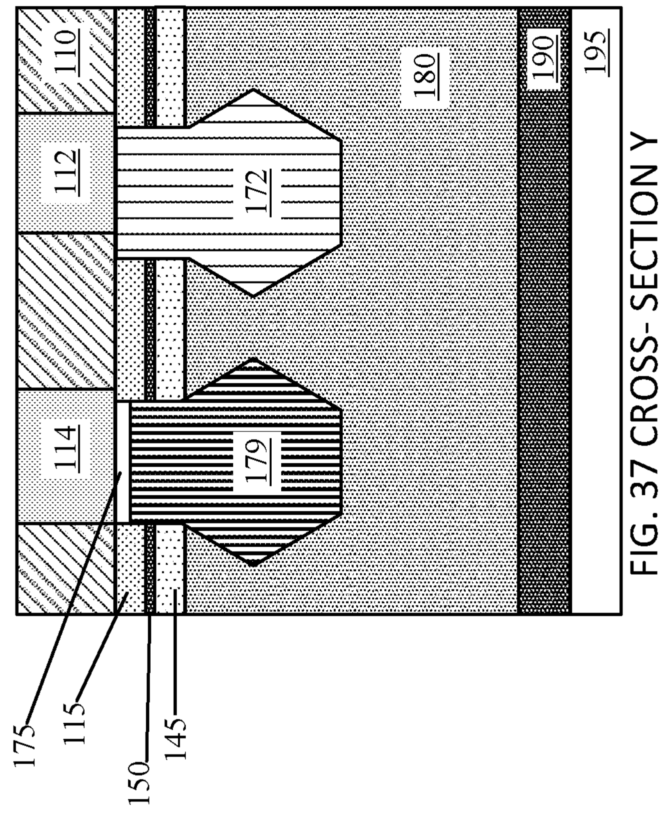
FIG. 37 CROSS- SECTION Y

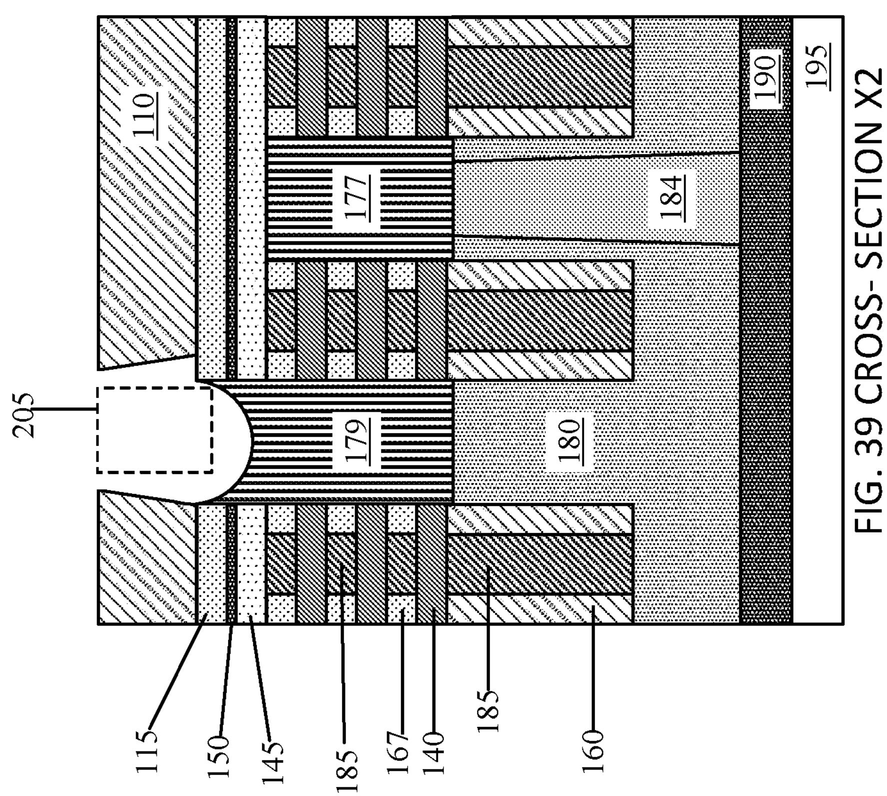
205
110
177
179
184
180
190
195
115
150
145
185
167
140
185
160
FIG. 39 CROSS- SECTION X2
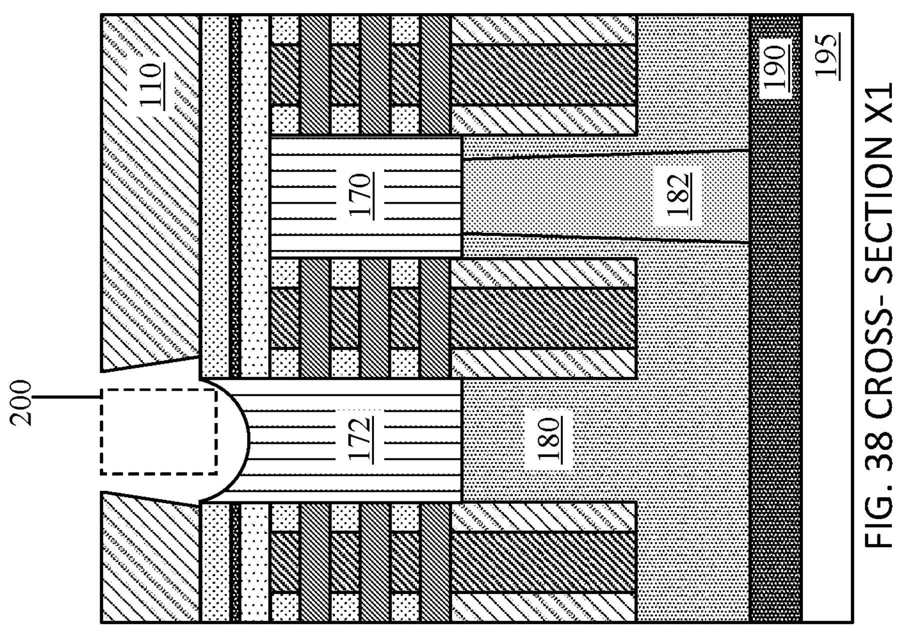
200
110
170
172
182
180
190
195
FIG. 38 CROSS- SECTION X1

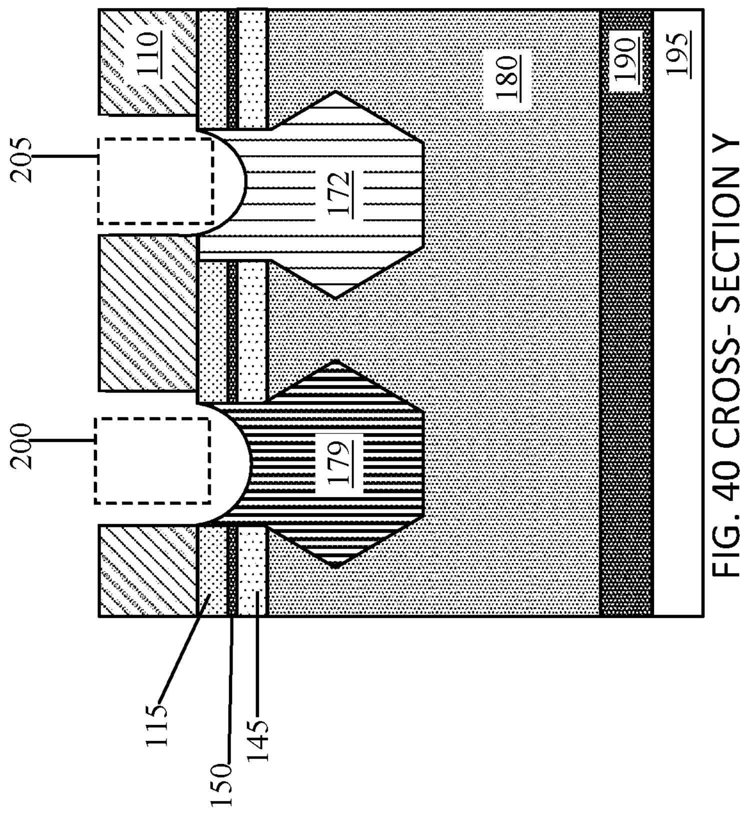
FIG. 40 CROSS- SECTION Y

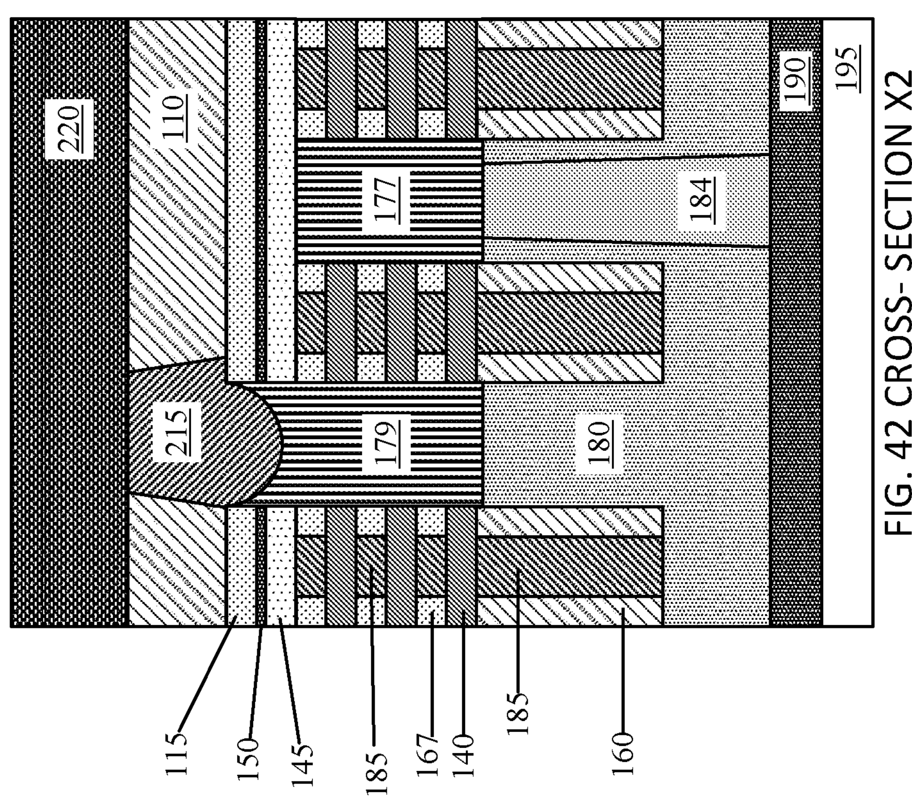
FIG. 42 CROSS- SECTION X2
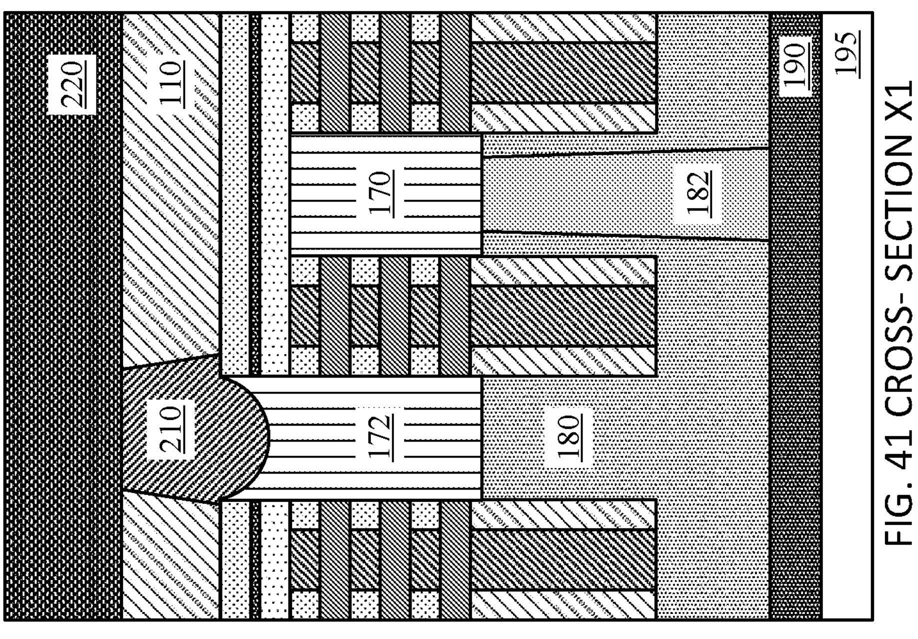
FIG. 41 CROSS- SECTION X1

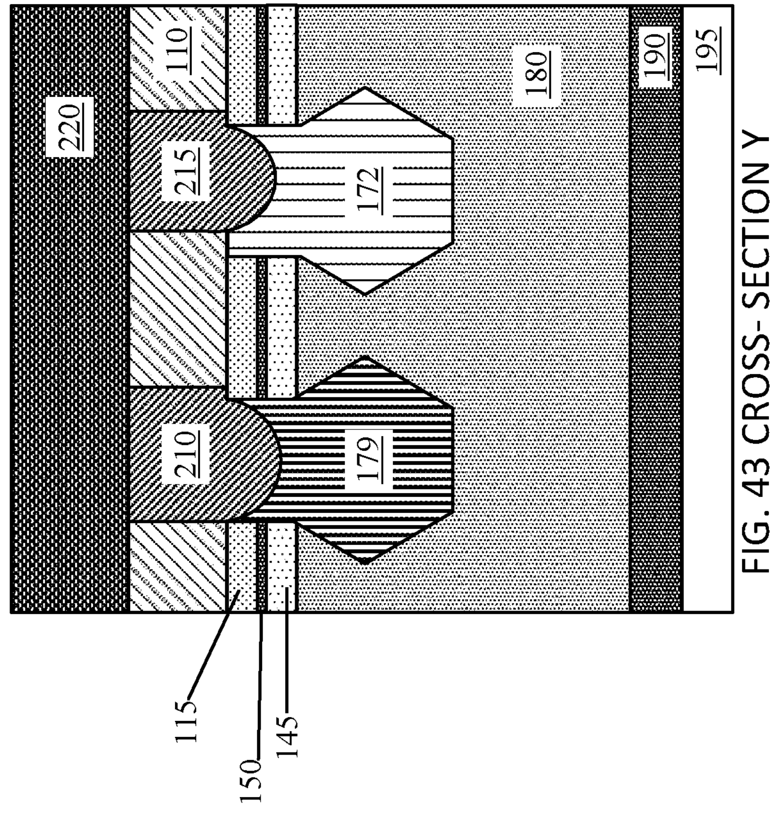
FIG. 43 CROSS- SECTION Y

TRANSISTORS WITH BOTTOM DIELECTRIC ISOLATION AND FULLY SELF-ALIGNED DIRECT BACKSIDE CONTACT

BACKGROUND

The present invention generally relates to the field of microelectronics, and more particularly to the formation of transistors with self-aligned backside contacts.

Nanosheet is the lead device architecture in continuing CMOS scaling. However, nanosheet technology has shown issues when scaling down such that as the devices become smaller and closer together, they are interfering with each other. With the number of devices being fitted in a smaller area it is becoming harder to form necessary contacts and to make sure the contacts are properly aligned.

BRIEF SUMMARY

Additional aspects and/or advantages will be set forth in part in the description which follows and, in part, will be apparent from the description, or may be learned by practice of the invention.

A microelectronic device including a nanosheet transistor that includes a first source/drain and a second source/drain. A frontside contact connected to the first source/drain and a backside contact connected to the second source/drain. A plurality of isolation layers located beneath the nanosheet transistor, and the second source/drain extends through the plurality of isolation layers to connect with the backside contact.

The microelectronic device includes a first source/drain and a second source/drain. A frontside contact connected to the first source/drain and a backside contact connected to the second source/drain. A plurality of isolation layers located beneath the nanosheet transistor, and the second source/drain extends through the plurality of isolation layers to connect with the backside contact. The backside contact extends into the plurality of isolation layers to connect with the second source/drain.

A method includes the steps of forming on a first substrate a backside interlayer dielectric layer. Forming at least one backside contact placeholder in the backside interlayer dielectric layer and forming a first dielectric layer on top of the backside interlayer dielectric layer and on top of the at least one backside contact placeholder. Forming on a second substrate a plurality of alternating layers comprised of channel layers and sacrificial layers. Forming a second dielectric layer on top of the alternating layers. Flipping the second substrate over and attaching the second dielectric layer to the first dielectric layer and forming a nanosheet transistor from the alternating layers.

BRIEF DESCRIPTION OF THE DRAWINGS

The above and other aspects, features, and advantages of certain exemplary embodiments of the present invention will be more apparent from the following description taken in conjunction with the accompanying drawings, in which:

FIG. 2 illustrates a cross section X1 of substrate A after the formation of a plurality of placeholders and a first dielectric layer, in accordance with the embodiment of the present invention.

FIG. 3 illustrates a cross section X2 of substrate A after the formation of a plurality of placeholders and a first dielectric layer, in accordance with the embodiment of the present invention.

FIG. 4 illustrates a cross section X1 of substrate B after the formation of alternating layers, in accordance with the embodiment of the present invention.

FIG. 5 illustrates a cross section X2 of substrate B after the formation of alternating layers, in accordance with the embodiment of the present invention.

FIG. 6 illustrates a cross section Y of substrate A in the source/drain region after the formation of a plurality of placeholders and a first dielectric layer, in accordance with the embodiment of the present invention.

FIG. 7 illustrates a cross section Y of substrate B in the source/drain region after the formation of the alternating layers, in accordance with the embodiment of the present invention.

FIG. 8 illustrates a cross section X1 of substrate A after flipping of Substrate B, in accordance with the embodiment of the present invention.

FIG. 9 illustrates a cross section X2 of substrate A after flipping of Substrate B, in accordance with the embodiment of the present invention.

FIG. 10 illustrates a cross section X1 of substrate B after flipping of Substrate B, in accordance with the embodiment of the present invention.

FIG. 11 illustrates a cross section X2 of substrate B after flipping of Substrate B, in accordance with the embodiment of the present invention.

FIG. 12 illustrates a cross section Y of substrate A in the source/drain region after flipping of Substrate B, in accordance with the embodiment of the present invention.

FIG. 13 illustrates a cross section Y of substrate B in the source/drain region after flipping of Substrate B, in accordance with the embodiment of the present invention.

FIG. 14 illustrates a cross section X1 of substrate A after attaching Substrate B to Substrate A and removal of a plurality of layers, in accordance with the embodiment of the present invention.

FIG. 15 illustrates a cross section X2 of substrate A after attaching Substrate B to Substrate A and removal of a plurality of layers, in accordance with the embodiment of the present invention.

FIG. 16 illustrates a cross section Y of substrate A in the source/drain region after attaching Substrate B to Substrate A and removal of a plurality of layers, in accordance with the embodiment of the present invention.

FIG. 17 illustrates a cross section X1 of the nano device after the formation of the dummy gate, a hardmask, and an upper spacer, in accordance with the embodiment of the present invention.

FIG. 18 illustrates a cross section X2 of the nano device after the formation of the dummy gate, a hardmask, and an upper spacer, in accordance with the embodiment of the present invention.

FIG. 19 illustrates a cross section Y of nano device in the source/drain region after separating the alternating layers into a plurality of columns, in accordance with the embodiment of the present invention.

FIG. 20 illustrates a cross section X1 of the nano device after separating the alternating layers into a plurality of columns and formation of an inner spacer, in accordance with the embodiment of the present invention.

FIG. 21 illustrates a cross section X2 of the nano device after separating the alternating layers into a plurality of columns and formation of an inner spacer, in accordance with the embodiment of the present invention.

FIG. 22 illustrates a cross section Y of nano device in the source/drain region after removal of the alternating layers to form the source/drain region, in accordance with the embodiment of the present invention.

FIG. 23 illustrates a cross section X1 of the nano device after etching the first and second dielectric layer to expose the backside contact placeholder, in accordance with the embodiment of the present invention.

FIG. 24 illustrates a cross section X2 of the nano device after etching the first and second dielectric layer to expose the backside contact placeholder, in accordance with the embodiment of the present invention.

FIG. 25 illustrates a cross section Y of nano device in the source/drain region after etching the first and second dielectric layer to expose the backside contact placeholder, in accordance with the embodiment of the present invention.

FIG. 26 illustrates a cross section X1 of the nano device after the formation of the source/drains, in accordance with the embodiment of the present invention.

FIG. 27 illustrates a cross section X2 of the nano device after the formation of the source/drains, in accordance with the embodiment of the present invention.

FIG. 28 illustrates a cross section Y of nano device in the source/drain region after the formation of the source/drains, in accordance with the embodiment of the present invention.

FIG. 29 illustrates a cross section X1 of the nano device after the formation of the frontside interlayer dielectric layer, in accordance with the embodiment of the present invention.

FIG. 30 illustrates a cross section X2 of the nano device after the formation of the frontside interlayer dielectric layer, in accordance with the embodiment of the present invention.

FIG. 31 illustrates a cross section Y of nano device in the source/drain region after the formation of the frontside interlayer dielectric layer, in accordance with the embodiment of the present invention.

FIG. 32 illustrates a cross section X1 of the nano device after the removal of the hardmask, the dummy gate, and the sacrificial layers, the formation of the gate, increasing the height of the frontside interlayer dielectric layer, and the formation of frontside contacts, in accordance with the embodiment of the present invention.

FIG. 33 illustrates a cross section X2 of the nano device after the removal of the hardmask, the dummy gate, and the sacrificial layers, the formation of the gate, increasing the height of the frontside interlayer dielectric layer, and the formation of frontside contacts, in accordance with the embodiment of the present invention.

FIG. 34 illustrates a cross section Y of nano device in the source/drain region after the removal of the hardmask, the dummy gate, and the sacrificial layers, the formation of the gate, increasing the height of the frontside interlayer dielectric layer, and the formation of frontside contacts, in accordance with the embodiment of the present invention.

FIG. 35 illustrates a cross section X1 of the nano device after the formation of back-end-of-the-line (BEOL) layer and a carrier wafer, flipping over the nano device for backside processing and the removal of the first substrate, in accordance with the embodiment of the present invention.

FIG. 36 illustrates a cross section X2 of the nano device after the formation of back-end-of-the-line (BEOL) layer and a carrier wafer, flipping over the nano device for backside processing and the removal of the first substrate, in accordance with the embodiment of the present invention.

FIG. 37 illustrates a cross section Y of nano device in the source/drain region after the formation of back-end-of-the-line (BEOL) layer and a carrier wafer, flipping over the nano device for backside processing and the removal of the first substrate, and the formation of frontside contacts, in accordance with the embodiment of the present invention.

FIG. 38 illustrates a cross section X1 of the nano device after the removal of the backside contact placeholders and the gouging of the source/drains, in accordance with the embodiment of the present invention.

FIG. 39 illustrates a cross section X2 of the nano device after the removal of the backside contact placeholders and the gouging of the source/drains, in accordance with the embodiment of the present invention.

FIG. 40 illustrates a cross section Y of nano device in the source/drain region after the removal of the backside contact placeholders and the gouging of the source/drains, in accordance with the embodiment of the present invention.

FIG. 41 illustrates a cross section X1 of the nano device after the formation of the backside contacts and a backside power distribution network, in accordance with the embodiment of the present invention.

FIG. 42 illustrates a cross section X2 of the nano device after the formation of the backside contacts and a backside power distribution network, in accordance with the embodiment of the present invention.

FIG. 43 illustrates a cross section Y of nano device in the source/drain region after the formation of the backside contacts and a backside power distribution network, in accordance with the embodiment of the present invention.

DETAILED DESCRIPTION

Figure 1:
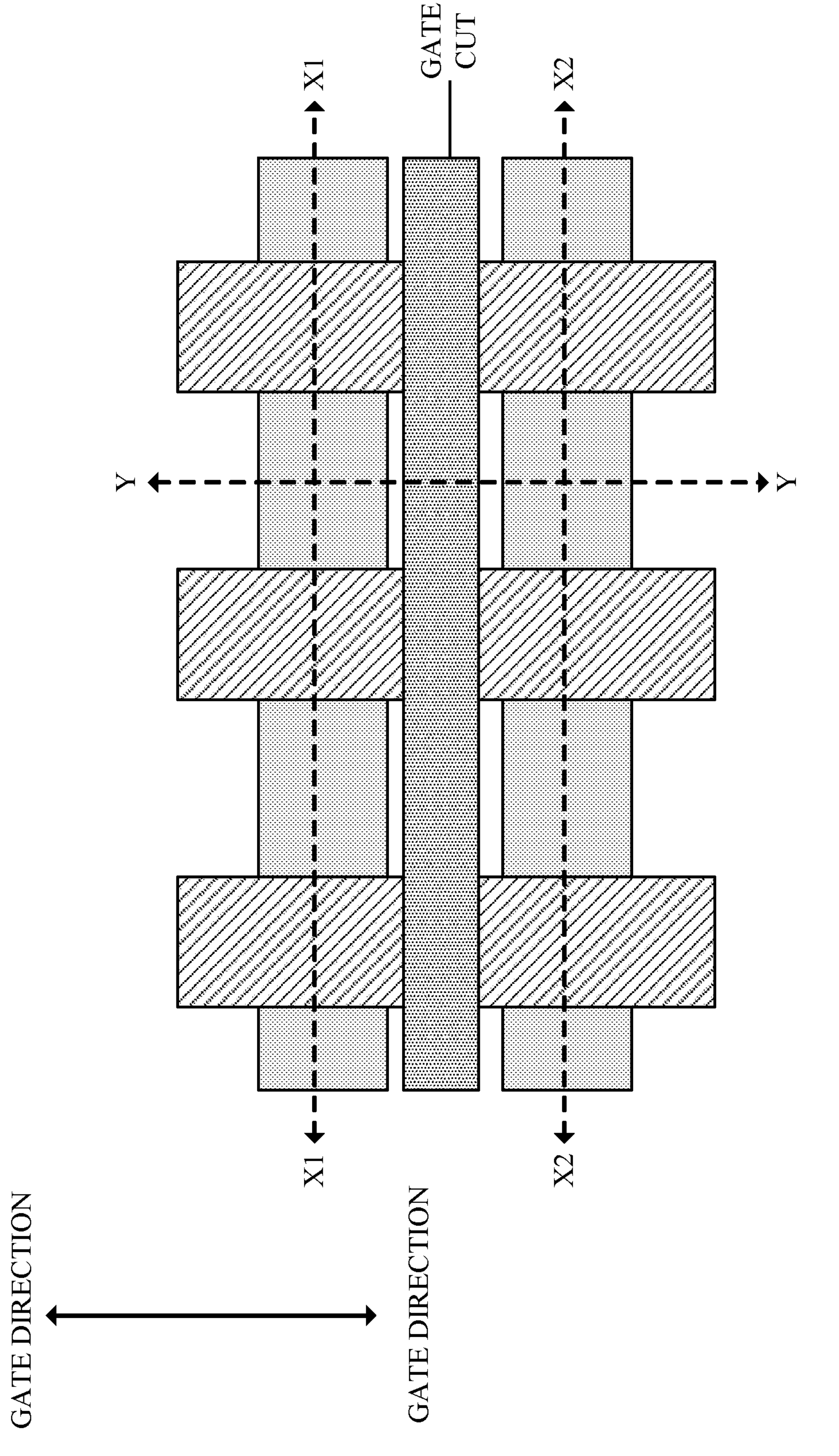
FIG. 1 illustrates a top-down view of multiple nano devices or transistors, in accordance with the embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art to affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, where intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various processes are used to form a micro-chip that will packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g., aluminum, copper, etc.) and insulators (e.g., various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, where like reference numerals refer to like elements throughout. The present invention is directed towards the formation of nanosheet transistors over self-aligned backside contacts. A plurality of first sacrificial components are formed in a first interlayer dielectric layer (backside interlayer dielectric layer) located on a first substrate. A first dielectric layer is formed on top of the first interlayer dielectric layer and the plurality of the first sacrificial components. On a second substrate a plurality of alternating layers (alternating sacrificial and channel layers, e.g., nanosheets) are formed and a second dielectric layer is formed on top of the alternating layers. The present invention is utilizing two separate starting substrates to separately form initial components/layers on each of the respective starting substrates. The second substrate (e.g., the substrate with the alternating layers) is flipped over and the second substrate is attached/bonded to the first dielectric layer located on the first substrate. The first and second dielectric layers can be comprised of different dielectric materials or the same dielectric materials. A bonding seam will be formed where the two dielectric layers are attached to each other, when the first and second dielectric layers are comprised of the same dielectric material. The present invention has the backside contact placeholders (i.e., the plurality of first sacrificial components) being formed independently and separate from the alternating layers that will form nanosheet transistors.

FIG. 1 illustrates a top-down view of multiple devices, nanosheet transistor or transistor, in accordance with the embodiment of the present invention. The cross-section X1 extends horizontally through the nano devices, nano stacks, or transistors of one of the devices. The cross-section X2 extends horizontally through the nano devices, nano stacks, or transistors of one of the devices, where cross-section X1 is parallel cross-section X2. Cross-sections X1 and X2 extend perpendicular to the gate direction. Cross section Y is perpendicular to cross sections X1 and X2, where cross-section Y is through a source/drain region that spans across multiple nano stacks. Cross section Y is in parallel with the gate direction.

Referring now to FIGS. 2, 3, and 6, illustrate a structure during an intermediate step of a method of fabricating a nanosheet transistor structure on a first substrate (Substrate A) according to an embodiment of the invention. Referring now to FIGS. 4, 5, and 6, illustrate a structure during an intermediate step of a method of fabricating a nanosheet transistor structure on a first substrate (Substrate B) according to an embodiment of the invention. FIGS. 2, 3, and 6 illustrate the processing stage after the formation of a plurality of backside contact placeholders in a backside interlayer dielectric layer located on substrate A. FIGS. 2, 3, and 6 illustrate a first substrate 105, a backside interlayer dielectric layer 110, a first backside contact placeholder 112, a second backside contact placeholder 114, and a first dielectric layer 115. The first dielectric layer 115 is comprised of a first dielectric material.

FIGS. 4, 5, and 7 illustrate the processing stage after the formation of a plurality of alternating layers. FIGS. 4, 5, and 7 illustrate a second substrate 120, an etch stop 125, a third substrate 130, a plurality of alternating sacrificial layers 135 and channel layers 140, and a second dielectric layer 145. The second dielectric layer 145 is comprised of a second dielectric material, where the first dielectric material and the second dielectric material can be the same or different materials. For simplicity reason the first dielectric layer 115 and the second dielectric layer 145 will be considered comprised of the same dielectric material. However, this is not meant to be seen as limiting and one of ordinary skills in the art could consider that these layers can be comprised of different dielectric materials.

The first substrate 105, the second substrate 120, and the third substrate 130 can be, for example, a material including, but not necessarily limited to, silicon (Si), silicon germanium (SiGe), Si: C (carbon doped silicon), carbon doped silicon germanium (SiGe: C), III-V, II-V compound semiconductor or another like semiconductor. In addition, multiple layers of the semiconductor materials can be used as the semiconductor material of the first substrate 105, the second substrate 120, and the third substrate 130. In some embodiments, first substrate 105, the second substrate 120, and the third substrate 130 includes both semiconductor materials and dielectric materials. The semiconductor first substrate 105, the second substrate 120, and the third substrate 130 may also comprise an organic semiconductor or a layered semiconductor such as, for example, Si/SiGe, a silicon-on-insulator or a SiGe-on-insulator. A portion or the entire semiconductor first substrate 105, the second substrate 120, and the third substrate 130 may also be comprised of an amorphous, polycrystalline, or monocrystalline. The semiconductor first substrate 105, the second substrate 120, and the third substrate 130 may be doped, undoped or contain doped regions and undoped regions therein.

The etch stop 125 can be comprised of, for example, epitaxial SiGe or SiO2, or another suitable material. The alternating layers includes a plurality of channel layers 140 (e.g., Si nano sheets), a plurality of sacrificial layers 135. The plurality of sacrificial layers 135 can be comprised of SiGe, where Ge is in the range of about 15% to 35%. The plurality of channel layers 140 can be comprised of, for example, Si.

FIGS. 8, 9, 10, 11, 12, and 13 illustrate the processing stage after flipping over Substrate B to make the second dielectric layer 145 face/orientated towards the first dielectric layer 115. FIGS. 14, 15, and 16 illustrate the processing stage after attaching Substrate B to Substrate A and removal of a plurality of layers. After Substrate B is flipped over, then Substrate B is attached/bonded to Substrate A, hereinafter the Substrate A and Substrate B will not be referred to as separate substrates.

The second dielectric layer 145 located on Substrate B is attached/bonded to the first dielectric layer 115 located on Substrate A. A bonding seam 150 will be formed between the first dielectric layer 115 and the second dielectric layer 145, when the dielectric layer layers are comprised of the same dielectric material. When the first dielectric layer 115 and the second dielectric layer 145 are comprised of different dielectric materials, then two distinct dielectric layers will form and/or additionally a bonding seam 150 can be formed. The second substrate 120, the etch stop 125, and the third substrate 130 are removed. A sacrificial layer 135 is needed to be formed on the third substrate 130 to allow for the formation of the alternating layer. This sacrificial layer 135 is removed to expose a top channel layer 140, which was the channel layer 140 that was formed closest the removed third substrate 130. At this stage of processing, the first dielectric layer 115, the bonding seam 150, and the second dielectric layer 145 separates the alternating layers from the backside interlayer dielectric layer 110 and the backside contact placeholders 112, 114.

FIGS. 17, 18, and 19 illustrate the processing stage after separating the alternating layers are separated into a plurality of columns and the formation of a dummy gate 155, a hardmask 165, and upper spacers 160. FIG. 19 illustrates how the alternating layers are separated into a plurality of columns. Each of the columns should be aligned/orientated over one of the backside contact placeholders 112, 114. FIG. 19 illustrates the situation where the alternating columns are miss-aligned over the backside contact placeholders 112, 114. The miss-alignment is that the alternating columns are not completely located above the backside contact placeholders 112, 114. FIGS. 17 and 18 illustrate that dummy gate

155 is formed on the top channel layer 140 and a hardmask 165 is formed on top of the dummy gate 155. The hardmask 165 and the dummy gate 155 are etched/pattern to form a plurality of columns. An upper spacer 160, or gate spacer, is formed on the sidewalls of each of the dummy gate 155 and hardmask 165 columns.

FIGS. 20, 21, and 22 illustrate the processing stage after separating the alternating layers into a plurality of columns, the formation of an inner spacer 167, and removal of a portion of the alternating layers to form the source/drain region. The alternating layers are etched to form a plurality of columns or nano stacks, and to form the source/drain region. The sacrificial layers 135 are recessed back to form a void/empty space around the ends of the channel layers 140. The void/empty space is filled with an inner spacer 167. One of the source/drain regions is aligned over/located above the first backside contact placeholder 112 and one of the source/drain regions is aligned over/located above the second backside contact placeholder 114.

FIGS. 23, 24, and 25 illustrate the processing stage after etching the first and second dielectric layer 115, 145 and the bonding seam 150 to expose the backside contact placeholder 112, 114. The second dielectric layer 145, the bonding seam 150, and the first dielectric layer 115 are etched in the source/drain regions to expose the top surface of the first and second backside contact placeholders 112, 114. In the situation when the etching processing is not aligned properly then the top surface of the backside interlayer dielectric layer 110 is exposed. The backside interlayer dielectric layer 110 will act as an etch stop for the etching process to expose the first and second backside contact placeholders 112, 114.

FIGS. 26, 27, and 28 illustrate the processing stage after the formation of the source/drains 170, 172, 177, 179. A first source/drain 172 is epitaxially grown over the first backside contact placeholder 112 and the second source/drain 170 is epitaxially grown in a source/drain region on top of the second dielectric layer 145. The first source/drain 172 extends downwards through the first dielectric layer 115, the second dielectric layer 145, and the bonding seam 150 to be in contact with a frontside/top surface of the first backside contact placeholder 112. The bottom surface of the first source/drain 172 is located lower than the bottom surface of the second source/drain 170. A third source/drain 179 is epitaxially grown over the second backside contact placeholder 114 and the fourth source/drain 177 is epitaxially grown in a source/drain region on top of the second dielectric layer 145. FIG. 27 illustrates a substrate spacer 175 being located between the second backside contact placeholder 114 and the third source/drain 179. The bottom surface of the third source/drain 179 is located lower than the bottom surface of the fourth source/drain 177.

The first source/drain 172, the second source/drain 170, the third source/drain 179, and the fourth source/drain 177, can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques.

FIGS. 29, 30, and 31 illustrate the processing stage after the formation of the frontside interlayer dielectric layer 180. A frontside interlayer dielectric layer 180 is formed on top and around the source/drain 170, 172, 177, 179. The frontside interlayer dielectric layer 180 is also formed on top of the second dielectric layer 145.

FIGS. 32, 33, and 34 illustrate the processing stage after the removal of the hardmask 165, the dummy gate 155, and the sacrificial layers 135, the formation of the gate 185, increasing the height of the frontside interlayer dielectric layer 180, and the formation of frontside contacts 182, 184. The hardmask 165 is removed by, for example, chemical mechanical processing (CMP) to expose the dummy gate 155. The dummy gate 155 and the sacrificial layers 135 are selectively removed to create empty space/voids for the formation of gate 185. Gate 185 is formed around the channel layers 140 and extends above the top channel layer 140 to be located between segments of upper spacer 160. Gate 185 can be comprised of, for example, a gate dielectric liner, such as high-k dielectric like $HfO_2$, $ZrO_2$, $HfL_aO_x$, etc., and work function layers, such as TiN, TiAlC, TiC, etc., and conductive metal fills, like W.

Additional frontside interlayer dielectric 180 is deposited to extend the layer on top of gate 185. A plurality of trenches (not shown) are formed in the frontside interlayer dielectric layer 180. The plurality of trenches is filled with a conductive metal during a metallization process to form frontside contacts 182, 184. The frontside contacts 172, 174 are located above and in contact with the second source/drain 170 and the fourth source/drain 177, respectively.

FIGS. 35, 36, and 37 illustrate the processing stage after the formation of back-end-of-the-line (BEOL) layer 190 and a carrier wafer 195, flipping over the nano device for backside processing and the removal of the first substrate 105. Back-end-of-the-line (BEOL) layer 190 is formed on the frontside surface of the frontside interlayer dielectric layer 180 and on the frontside surface of the frontside contacts 182, 184. Carrier wafer 195 is attached to the BEOL layer 190 and the nano device is flipped over for backside processing. The first substrate 105 is removed to expose a backside surface of the backside interlayer dielectric layer 110, and a backside surface of the first and second backside contact placeholders 112, 114.

FIGS. 38, 39, and 40 illustrate the processing stage after the removal of the backside contact placeholders 112, 114 and the gouging of the source/drains 172, 179. The first and second backside contact placeholders 112, 114 are removed. The removal of the first and second backside contact placeholders 112, 114 can expose a backside surface of the first source/drain 172 or expose a backside surface of the substrate spacer 175. The gouging of the backside surface of the first source/drain 172 creates an indention/crater into the source/drain, thus increasing the exposed surface area of the first source/drain 172. The indention/crater can extend lower, same height or higher than the bonding seam 150 level. Gouging into the third source/drain 179 removes the substrate spacer 179. Since the first dielectric layer 115, the bonding seam 150, and the second dielectric layer 145 prevent one of the adjacent gates 185 from being exposed by the gouging processing. The removal of the first backside contact placeholder 112 and the gouging of the first source/drain 172 creates a first backside contact trench 200. The removal of the second backside contact placeholder 114 and the gouging of the third source/drain 179 creates a second backside contact trench 205. The first dielectric layer 115, the bonding seam 150, and the second dielectric layer 145 act as a separating layer between the first and second backside contact trench 200, 205 and the adjacent gates 185, respectively.

FIGS. 41, 42, and 43 illustrate the processing stage after the formation of the backside contacts 210, 215 and a backside power distribution network 229. The first backside contact trench 200 and the second backside contact trench 205 are filled in with a conductive metal to form a first backside contact 210 and a second backside contact 215. The first backside contact trench 200 and the second backside contact trench 205 can be in contact with the first dielectric layer 115. The first backside contact trench 200 and the second backside contact trench 205 can also be in contact with the bonding seam 150 and/or the second dielectric layer 145 depending on the depth of the gouging of the first source/drain 172 and the third source/drain 179. A backside-power-distribution-network (BSPDN) 220 is formed on top of the backside interlayer dielectric layer 110 and on top of the first and second backside contact 210, 215. The second dielectric layer 145, the bonding seam 150, and the first dielectric layer 115 forms a plurality of isolation layers that separate the nanosheet transistor from the backside contacts 210, 215 and the BSPDN 220. The first source/drain 172 and the third source/drain 179 extend through the plurality of isolation layers to connect with the backside contacts 210, 215, respectively. Such that the second dielectric layer 145, the boding seam 150, and the first dielectric layer 115 are in contact with a sidewall of the first source/drain 172 and a sidewall of the third source/drain 179.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A microelectronic device comprising:

a nanosheet transistor that includes a first source/drain and a second source/drain;

a frontside contact connected to the first source/drain and a backside contact connected to the second source/drain; and a plurality of isolation layers located beneath the nanosheet transistor, wherein the second source/drain extends through the plurality of isolation layers to connect with the backside contact, wherein the second source/drain is in direct contact with each of the plurality of isolation layers.

2. The microelectronic device of claim 1, wherein one of the plurality of isolation layers is in direct contact with a backside surface of the first source/drain.

3. The microelectronic device of claim 1, wherein a backside surface of the first source/drain and a backside surface of the second source/drain are located at different heights.

4. The microelectronic device of claim 1, wherein the plurality of isolation layers includes at least a first dielectric layer and a second dielectric layer.

5. The microelectronic device of claim 4, wherein the first dielectric layer and the second dielectric layer are comprised of the same dielectric material.

6. The microelectronic device of claim 5, further comprising a bonding seam located between the first dielectric layer and the second dielectric layer.

7. The microelectronic device of claim 6, wherein the first dielectric layer is in contact with a backside surface of the first source/drain, and wherein the first dielectric layer is in contact with a sidewall of the second source/drain.

8. The microelectronic device of claim 7, wherein the backside contact is in contact with the second dielectric layer.

9. The microelectronic device of claim 4, wherein the first dielectric layer and the second dielectric layer are comprised of the different dielectric material.

10. A microelectronic device comprising: a nanosheet transistor that includes a first source/drain and a second source/drain; a frontside contact connected to the first source/drain and a backside contact connected to the second source/drain; a plurality of isolation layers located beneath the nanosheet transistor, wherein the second source/drain extends through the plurality of isolation layers to connect with the backside contact, wherein the backside contact extends into the plurality of isolation layers to connect with the second source/drain, wherein the second source/drain is in direct contact with each of the plurality of isolation layers.

11. The microelectronic device of claim 10, wherein one of the plurality of isolation layers is in direct contact with the backside surface of the first source/drain.

12. The microelectronic device of claim 10, wherein a backside surface of the first source/drain and a backside surface of the second source/drain are located at different heights.

13. The microelectronic device of claim 10, wherein the plurality of isolation layers includes at least a first dielectric layer and a second dielectric layer.

14. The microelectronic device of claim 13, wherein the first dielectric layer and the second dielectric layer are comprised of the same dielectric material.

15. The microelectronic device of claim 14, further comprising a bonding seam located between the first dielectric layer and the second dielectric layer.

16. The microelectronic device of claim 15, wherein the first dielectric layer is in contact with a backside surface of the first source/drain, and wherein the first dielectric layer is in contact with a sidewall of the second source/drain.

17. The microelectronic device of claim 16, wherein the backside contact is in contact with the second dielectric layer.

18. The microelectronic device of claim 13, wherein the first dielectric layer and the second dielectric layer are comprised of the different dielectric material.

* * * * *